(12) United States Patent
Courtel

(10) Patent No.: US 7,375,506 B2
(45) Date of Patent: May 20, 2008

(54) DEVICE FOR COMPARING AN INPUT SIGNAL WITH A SET VALUE AND CORRESPONDINNG ELECTRONIC CIRCUIT

(75) Inventor: Karl Courtel, Reze (FR)

(73) Assignee: Atmel Nantes SA, Nantes (FR)

( * ) Notice: Subject to any disclaimer, the term of this patent is extended or adjusted under 35 U.S.C. 154(b) by 0 days.

(21) Appl. No.: 11/495,155

(22) Filed: Jul. 28, 2006

(65) Prior Publication Data
US 2007/0040546 A1     Feb. 22, 2007

(30) Foreign Application Priority Data
Jul. 29, 2005   (FR) .................................. 05 08191

(51) Int. Cl.
*G01R 13/02* (2006.01)
(52) U.S. Cl. .................... 324/76.82; 341/155; 341/161
(58) Field of Classification Search ............ 324/76.82; 327/72; 341/155, 161
See application file for complete search history.

(56) References Cited

U.S. PATENT DOCUMENTS

| 4,370,067 A | 1/1983 | Iwakura et al. ............. 368/202 |
|---|---|---|
| 5,180,927 A * | 1/1993 | Poletto ........................ 327/198 |
| 5,252,976 A | 10/1993 | Miho et al. ................. 341/163 |
| 5,955,978 A | 9/1999 | Fiedler et al. .............. 341/118 |
| 5,977,762 A | 11/1999 | Murtha, Jr. et al. ........... 324/72 |
| 2006/0092068 A1* | 5/2006 | Ko et al. ..................... 341/155 |

FOREIGN PATENT DOCUMENTS

JP     10 062454     3/1998

* cited by examiner

Primary Examiner—Vincent Q. Nguyen
(74) Attorney, Agent, or Firm—David D. Brush; Westman, Champlin & Kelly, P.A.

(57) ABSTRACT

A comparison device includes a one-threshold comparator receiving an input signal and a set value and generating a resultant signal. The comparison device further includes a sampler for sampling the resultant signal and a controller for blocking the sampler, after a switching of the input signal, as long as a timeout mechanism does not indicate that a given timeout duration has elapsed since the verification of a predetermined instability criterion.

19 Claims, 3 Drawing Sheets

DEVICE FOR COMPARING AN INPUT SIGNAL WITH A SET VALUE AND CORRESPONDINNG ELECTRONIC CIRCUIT

CROSS-REFERENCE TO RELATED APPLICATION

None.

FIELD OF THE DISCLOSURE

The domain of the disclosure is integrated electronic circuits and more particularly circuits comprising analogue signal comparators, such as micro-controllers or systems on chip.

More precisely, the disclosure relates to the generation of a comparison signal in such circuits.

BACKGROUND OF THE DISCLOSURE

We will discuss hereinafter the disadvantages of prior art considering the special case of onboard comparators in a micro controller used in a slaving system.

Slaving systems are systems for which the output is equal to a set value as closely as possible. To achieve this, these systems use a feedback from the output of the system to its input, so that the measured signal at the output from the system (also called the comparator input signal) can be compared with a set value.

Therefore, it is normal that a slaving system comprises a micro controller equipped with a comparator that, after detecting an equality (or non-equality) between the input signal and the set value, generates a comparison signal (also called output signal in the remainder of this description), for example to directly modify execution of a slaving algorithm, to change the state of some outputs of the system or to control capture of a value of a counter that will be used by the algorithm to adjust system controls.

A very large number of comparison techniques are known to generate an output signal representing a difference between an input signal and a set value. This comparison signal varies between high and low logic levels as a function of the result of the comparison.

As illustrated on FIG. 1, the comparison with a "threshold" is a first technique according to which the output signal OUTPUT_1 switches over to the high logic level VCC when the input signal INPUT is greater than or equal to the set value VCONS, and to the low logic level VSS when the input signal INPUT is less than the set value VCONS.

This relatively old comparison technique has not been very successful for different reasons, and particularly sensitivity to noise.

The presence of a noisy signal at the comparator input may cause random operation or system failure, because when the noisy signal becomes close to the set value, the so-called one-threshold comparator generates unstable controls CMD_INST.

To overcome this problem, an analogue hysteresis is traditionally used on the comparator so that noise carried by the input signal is not retransmitted to the system.

More precisely and as illustrated in FIG. 1, a comparator with hysteresis (or a "two-threshold" comparator) (also called a Schmitt trigger) is characterized by two switching thresholds: a low switching threshold VIL and a high switching threshold VIH. According to this second technique, when the input signal INPUT reaches the high switching threshold VIH, the output signal OUTPUT_2 switches from the low logic level VSS to the high logic level VCC and when the input signal INPUT reaches the low switching threshold VIL, the output signal OUTPUT_2 switches from the high logic level VCC to the low logic level VSS.

Note that as the difference between the high switching threshold VIH and the low switching threshold VIL becomes greater, the comparator becomes more reliable and insensitive to parasite fluctuations superimposed on the input signal INPUT. This voltage difference between the two switching thresholds VIH and VIL is called hysteresis. The difference between the high switching threshold VIH and the low switching threshold VIL also forms the margin of immunity to noise that is the voltage difference that an input signal may have without leading to a particular incident on operation of a system.

Although the comparator with hysteresis was a major step forward in the mechanism to generate a comparison signal without instability, the second known technique does have the disadvantages that it is expensive in silicon surface area and is not very efficient. Hysteresis is typically adjusted to the maximum noise value that the signal to be observed is supposed to carry at the output from the slaving system (in other words the comparator input signal). This maximum noise value is particularly difficult to estimate since microcontrollers have been developed for a wide variety of applications and not for a specific application. It would be possible to implement adjustable analogue hysteresis on comparators. However, this would make this second technique according to prior art even more expensive in silicon surface area.

Another major disadvantage of this second known technique is due to the fact that hysteresis introduces a delay on availability of information, and this delay is additional to the time necessary for the slaving algorithm to adjust its actions on the system. Thus, this latency between equality of the input signal and the set value and the reaction of the system may reduce the precision of system control.

SUMMARY

An embodiment of the invention is directed to a comparison device that receives an analogue input signal and a set value, and outputs a digital output signal, said output signal being capable of switching between a high logic level and a low logic level or vice versa. The device comprises a one-threshold comparator receiving said input signal and said set value, and said comparator generates a resultant signal that depends on the result of the comparison.

According to an embodiment of the invention, the device comprises methods of sampling said resultant signal and means of controlling said sampling means, to block said sampling means as long as a timeout mechanism does not indicate that a given timeout duration has elapsed since verification of at least one predetermined instability criterion, said timeout mechanism being reinitialized with said timeout duration every time that said at least one predetermined instability criterion is satisfied. If said sampling means are not blocked, they are used to copy said resultant signal at the output of said device.

Thus, an embodiment of the invention is based on a quite new and inventive approach to generate a comparison signal in an integrated circuit. An embodiment of the invention proposes to associate a one-threshold comparator with an anti-bounce mechanism. This anti-bounce mechanism is capable of detecting instabilities of the resultant signal (in other words unstable controls generated at the comparator output) and when applicable to delete them.

Control means are used to achieve this, that deactivate sampling of the comparator output during the operating period of a timeout mechanism, so as to keep the resultant voltage at its current logic level. The anti-bounce mechanism also contains information about the equality of the input signal and the set value, without any delay which is not the case for the technique according to prior art mentioned above.

According to one advantageous aspect of an embodiment of the invention, said at least one predetermined instability criterion is a switching of said resultant signal.

In a first variant, the timeout mechanism is reinitialized on the rising or falling fronts of the resultant signal.

Note that rising front means switching a signal from a low logic level to a high logic level, the falling front being reverse switching.

In a second variant, the timeout mechanism is reinitialized after a determined number of successive switchings of the resultant signal.

Preferably, said timeout duration is greater than the period of the lowest frequency noise to be deleted.

An embodiment of the invention is based on the following observation: the fundamental frequency of noise present on an application is usually better known than its level. The best known case is a 50 Hz mains power supply, for which it is known that its fundamental frequency can make low frequency signals noisy, but for which it is difficult to evaluate the level of the 50 Hz frequency that will be superimposed on the input signal, at the system design stage.

Thus, an embodiment of the invention proposes digital filtering of high frequency signals (carried by the input signal) for which the period is less than a timeout duration.

Advantageously, said control means include means of detecting switching of said resultant signal generating a signal in steps, called the detection signal, that changes between a first value and a second value every time that a switching is detected. Said timeout mechanism includes a time base with a first input called the loading input to which said detection signal is applied, and a second input called the authorization input to which said inverse detection signal is applied, such that:

when said detection signal is equal to said first value, said time base is preloaded with said timeout duration; then when said detection signal is equal to said second value, said time base authorizes said preloaded timeout duration to elapse.

An embodiment of this invention covers a first case in which the time base is a digital counter for incrementing a start value until reaching an end value. The elapsed time between the start value and the end value is equal to the timeout value preloaded in the counter.

An embodiment of the invention also covers a second case in which the time base is a digital countdown counter for decrementing a start value until reaching an end value. The time elapsed between the start value and the end value is equal to the timeout duration preloaded in the countdown counter.

Preferably, said switching detection means comprise:

a flip-flop receiving said resultant signal and outputting a delayed resultant signal;

an EXCLUSIVE OR logic gate that receives said resultant signal and said delayed resultant signal and that outputs said detection signal, such that:

if said resultant signal and said delayed resultant signal are at different logic levels, said EXCLUSIVE OR logic gate fixes said detection signal equal to said first value;

if said resultant signal and said delayed resulting signal are at the same logic level, said EXCLUSIVE OR logic gate fixes said detection signal equal to said second value.

Advantageously, said time base includes a feedback from the output of said time base to said authorization input so as to block said time base when said timeout duration has elapsed, until switching of said resultant signal is detected.

Preferably, said time base is programmable.

Thus, it is possible to configure the time base parameters (timeout duration, start value, end value, etc.) as a function of the frequencies of noise to be deleted.

The time base parameters can also be adapted dynamically as a function of the noise frequency detected on the input signal.

In one preferred embodiment of the invention, the device comprises means of resynchronization between said comparator and said control means so as to resynchronize said resultant signal on a clock signal.

In general, the output signal from a comparator (resultant signal) is an asynchronous signal that has to be resynchronized on a clock, so that it can be used by its synchronous logic circuits.

According to an embodiment of the invention, resynchronization means also protect control means against logic problems generated at the output from the comparator.

A logic problem means a rising front followed by a falling front occurring during a time period shorter than the period of the clock signal.

According to one advantageous aspect of an embodiment of the invention, said resynchronization means comprise a flip-flop to copy said resultant signal to the output, at each active front of said clock signal.

An embodiment of the invention also relates to an electronic circuit including a comparison device like that described above.

Other characteristics and advantages will become clearer after reading the following description of a preferred embodiment, given as a simple illustrative and non-limitative example and with reference to the appended figures.

DETAILED DESCRIPTION OF ILLUSTRATIVE EMBODIMENTS

The general principle of an embodiment is based on the addition of an anti-bounce mechanism at the output from a comparator.

According to an embodiment, a controller includes a detector to detect a state change at the output from a comparator, and if possible to reinitialize a timeout mechanism with a determined timeout duration. The controller prevents sampling of the comparator output after positive detection of an unstable control.

In order to simplify the description, the remainder of this document will be restricted to describing a comparison device operating with a timeout mechanism equipped with a digital countdown counter. Those skilled in the art will easily extend this information to include a comparison device operating with a timeout mechanism equipped with a digital counter.

A comparison device 100 is described with reference to FIG. 2, according to one preferred embodiment.

Figure 1:
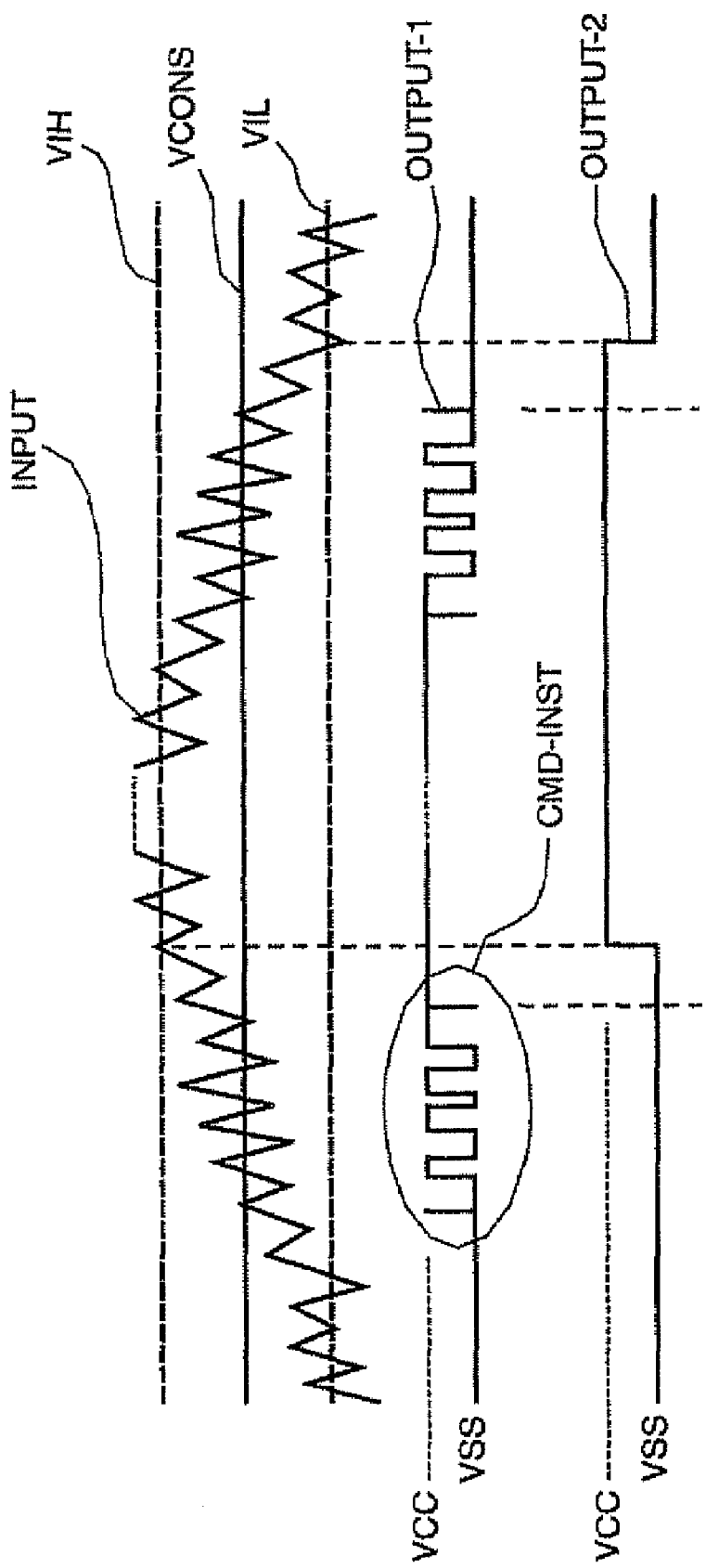
FIG. 1, already commented upon in relation to prior art, is a set of graphs showing firstly how the comparison signal generated at the output from a conventional one-threshold comparator varies, and secondly how the comparison signal generated at the output from a conventional comparator with hysteresis varies as a function of the variation of a noisy input signal.

In this embodiment, the comparison device 100 comprises:
- a controller 3 including a timeout mechanism 32;
- a sampler 4, such as a sample circuit; and
- a one-threshold comparator 1, conventional in itself (the operation of which has already been described above with reference to FIG. 1).

The comparator 1 receives an analogue input signal INPUT on a first input 11 and a set value VCONS on a second input 12, and outputs a resultant signal RESULT at the output 13 that is equal to either the value of the high voltage power supply VCC (usually 5 V) (also called the high logic level in the remainder of the description), or the value of the low voltage power supply VSS (usually 0 V) (also called the low logic level in the remainder of this description), depending on the result of the comparison.

Note that the resultant signal RESULT is an asynchronous signal. In order to prevent a dysfunction of the logic part (in other words the circuits synchronized on a clock) of the device, the resultant signal RESULT is synchronized on a clock signal CLOCK. To achieve this, resynchronization circuit 2 is used mounted in series with the comparator 1. The resynchronization circuit 2 receives the resultant signal RESULT at the input 21 and output a synchronized signal RESULT_SYNC at the output 22.

These resynchronization circuit 2 comprises a D type flip-flop (not shown) active on the rising front, to copy the resultant signal RESULT to the output 22 at each rising front of the clock signal CLOCK and to maintain the synchronized signal RESULT_SYNC at its current logic level until the next rising front of the clock signal CLOCK.

In the embodiment illustrated, the controller 3 comprises a detector 31 acting on the timeout mechanism 32.

As will be seen in the remainder of the description, detector 31 firstly reinitializes the timeout mechanism 32 each time that the RESULT-SYNC synchronized signal is switched, and secondly prevent activation of the sampler 4, so as to delete unstable controls CMD_INST from the synchronized signal RESULT_SYNC.

In more detail, the detector 31 receives the synchronized signal RESULT-SYNC on an input 310, and produce a detection signal DETECT on the output 311 that switches to the high logic level VCC, then to the low logic level VSS each time that switching of the synchronized signal RESULT_SYNC is detected. Thus, the detector 31 generates a step at each rising and falling front of the synchronized signal RESULT_SYNC.

Even more precisely, the detector 31 comprises an EXCLUSIVE OR logic gate 312 and a flip-flop 313 mounted in series on one of the inputs of the EXCLUSIVE OR logic gate 312.

The flip-flop 313 receives the RESULT_SYNC synchronized signal on an input 3131 and outputs a delayed signal RESULT_DELAY on the output 3132. This flip-flop 313 is thus used to add a delay equal to one period of the clock signal CLOCK on the synchronized signal RESULT_SYNC.

The EXCLUSIVE OR logic gate 312 receives the synchronized signal RESULT_SYN on a first input 3121, and the delayed signal RESULT_DELAY on a second input 3122 (sent to the output from the flip-flop 313).

Figure 3:
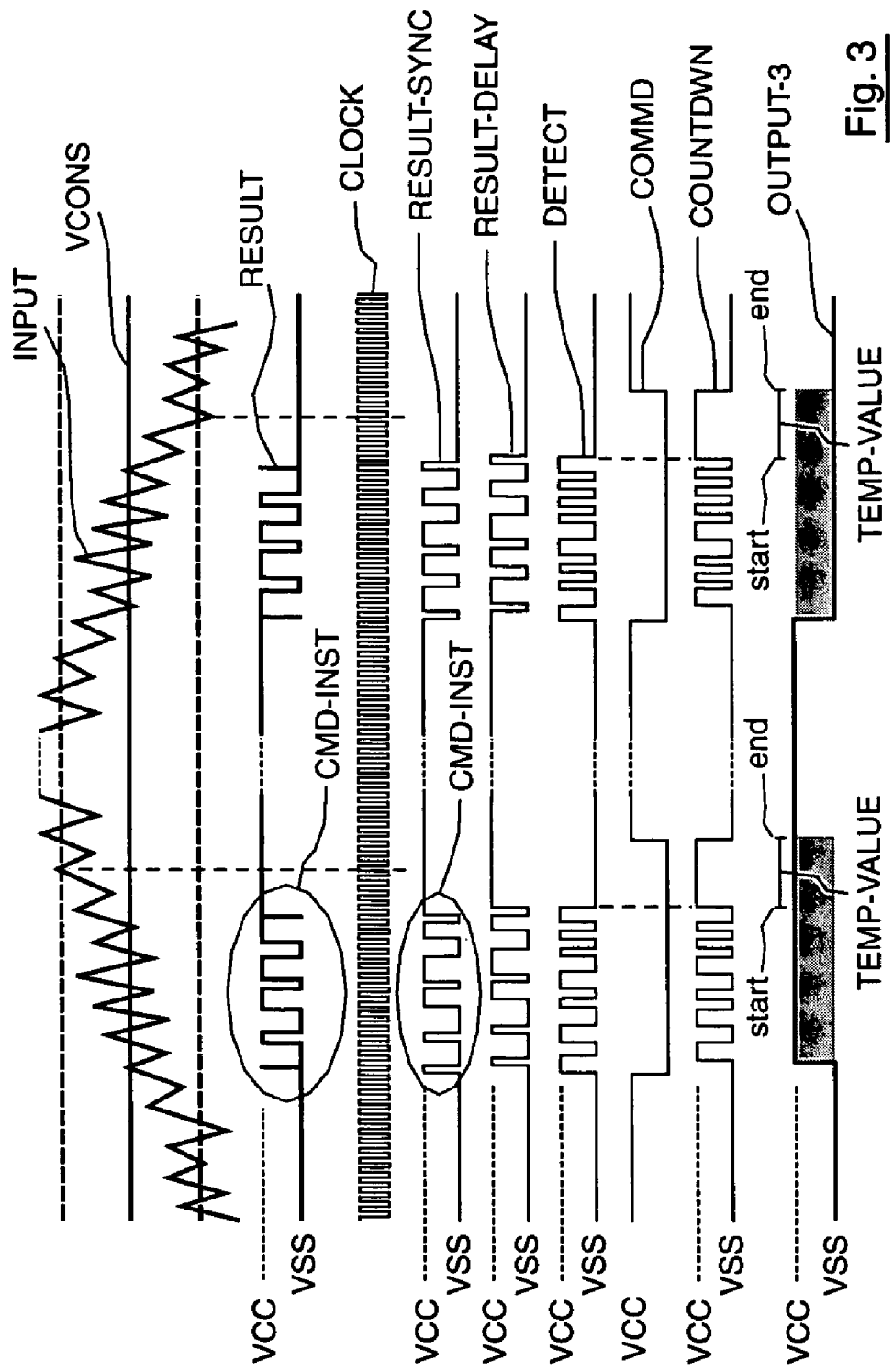
FIG. 3 illustrates the operation of the comparison device in FIG. 2.

As illustrated in FIG. 3, when the synchronized signal RESULT_SYNC and the delayed signal RESULT_DELAY are at different logic levels, then the detection signal DETECT sent to the output 311 is equal to the high logic level VCC.

Conversely, when the synchronized signal RESULT_SYNC and the delayed signal RESULT_DELAY are at the same logic level, the detection signal DETECT sent to the output 311, is equal to the low logic level VSS.

The detection signal DETECT is applied directly to the input 320 of the timeout mechanism 32; this mechanism then sends a control signal COMMD to the output 321 that, depending on the current state of the timeout mechanism, is equal to either the high logic level VCC or the low logic level VSS.

In this embodiment, the timeout mechanism 32 comprises a digital countdown counter 322 and an AND logic gate with inverted inputs 323 mounted in series on one of the inputs of the digital countdown counter 322.

The AND logic gate with inverted inputs 323 receives the detection signal DETECT on a first input 3231 and the control signal COMMD on a second input 3232 (sent to output 321 from the timeout mechanism), and delivers a COUNTDWN activation signal to output 3233.

The following refers to operation of the comparison device 100 according to a preferred embodiment, with reference to FIG. 3.

Thus, when the detection signal DETECT and the control signal COMMD are each at the low logic level VSS, in other words when the detector does not detect any switching of the synchronized signal RESULT_SYNC and when the timeout mechanism has been counted down, the COUNTDWN activation signal is equal to the value of the high logic level VCC.

On the other hand, when the detection signal DETECT is at the high logic level VCC (in other words detection of switching of the synchronized signal RESULT_SYNC) and/or when the control signal COMMD is at the high logic level VCC (in other words when the timeout mechanism has finished its countdown), the COUNTDWN activation signal is set equal to the low logical value VSS.

Figure 2:
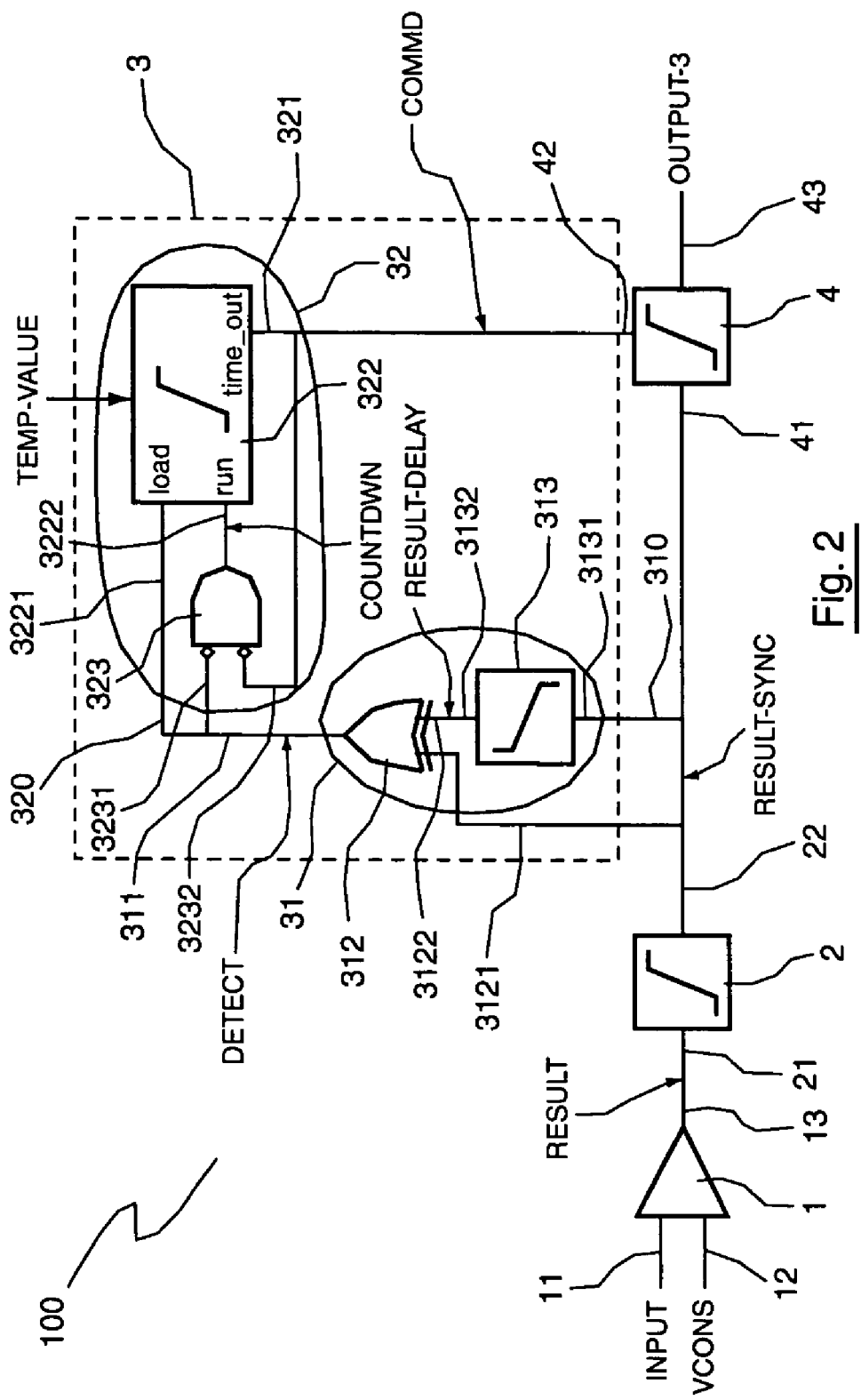
FIG. 2 shows the diagram of a comparison device according to a preferred embodiment of the invention.

As shown on FIG. 2, the digital countdown counter 322 receives the detection signal DETECT on a first input LOAD, called the load input, and the COUNTDWN activation signal on a second input RUN called the authorization input.

The digital countdown counter 322 is a logic sequencer that decrements a start value START (for example "10") by one unit at each clock tick, until reaching an END value (usually "0"). The time elapsed between the start value and the end value is called the timeout duration TEMP_VALUE. As already mentioned, this timeout duration TEMP_VALUE is chosen to be greater than the period of the lowest frequency noise carried by the input signal INPUT.

For example, for a 15 kHz input signal on which noise is superimposed at 1 MHz, the START value for an 8 MHz clock signal CLOCK may be set to "16" which gives a timeout duration TEMP_VALUE equal to 2 μs.

Thus, when the detection signal DETECT is at the high logic level VCC, the digital countdown counter 322 is reinitialized, in other words the digital countdown counter is set equal to the start value START.

Furthermore, when the COUNTDWN activation signal is at the high logic level VCC, the digital countdown counter 322 authorizes the countdown from the start value START.

Note that in this embodiment, the AND logic gate with inverted inputs 323 prevents simultaneous activation of the LOAD and RUN inputs. In other words, the case in which the detection signal DETECT and the COUNTDWN activation signal are both equal to the high logic level VCC is prohibited.

Note also that when the timeout duration TEMP_VALUE has elapsed, the AND logic gate with inverted inputs 323 fixes the COUNTDWN activation signal at the low logic level VSS, so as to block the digital countdown counter 322 on the END value, until switching of the RESULT_SYNC synchronized signal is detected.

As illustrated in FIG. 2, the sample circuit 4 receives the synchronized signal RESULT_SYNC on a first input 41, and the COMMD control signal sent to the TIME_OUT output of the digital countdown counter 322 on a second input 42.

The sample circuit 4 comprises a type D flip-flop (not shown), active on a rising front, such that if the value of the control signal COMMD is equal to the value of the high logic level VCC, then the synchronized signal RESULT_SYNC is copied to the output 43.

On the other hand (FIG. 3), if the value of the control signal COMMD is equal to the value of the low logic level VSS, then the output signal OUTPUT_3 is kept at its current logic level.

In summary, the comparison device as proposed has many advantages, some of which are mentioned in the non-exhaustive list below:

improved decision making; an embodiment is capable of detecting switchings of the comparator output signal and provides information about equality of the input signal and the set value with no delay;

improved stability; an embodiment is capable of eliminating unstable controls generated at the output from the comparator when the input signal becomes close to the set value, regardless of the input noise level.

Obviously, the invention is not limited to the example embodiments mentioned above.

In particular, those skilled in the art could modify the comparison logic, depending on the nature of the application. In particular, it would be possible to envisage programming of the timeout mechanism such that the timeout mechanism dynamically adapts its timeout parameters TEMP_VALUE, START and END and then to the noise frequency detected.

Similarly, the timeout mechanism can be implemented in any other manner, namely particularly with a digital counter and with a NOR logic gate.

In general, in other example embodiments, the TEMP_VALUE, START, END, VCC and VSS values may be different from the values given in the preferred embodiment described above.

An embodiment of the disclosure provides a technique for comparison of analogue signals that is simple to use and efficient, particularly in terms of decision making.

An embodiment proposes such a technique that can eliminate unwanted oscillations at the output from the comparator, generated when a noisy input signal becomes close to the set value given to the comparator.

An embodiment provides such a technique that does not lead to a significant increase in the size of the integrated circuit.

An embodiment provides such a technique that in at least one embodiment, is inexpensive and adapted to all standard applications of micro controllers and/or existing electronic systems on chip.

An embodiment further provides such a technique which, in one particular embodiment, is particularly suitable for digital slaving systems.

Although the invention has been described above with reference to a limited number of embodiments, after reading this description, those skilled in the art will understand that other embodiments could be imagined without departing from the scope of this invention.

What is claimed is:

1. A comparison device that receives an analogue input signal and a set value, and outputs a digital output signal, said output signal being capable of switching between a high logic level and a low logic level, or vice versa, said device comprising:

a one-threshold comparator receiving said input signal and said set value, said comparator generating a resultant signal that depends on the result of the comparison, a sampler, which samples said resultant signal; and a controller, which blocks said sampler as long as a timeout mechanism does not indicate that a given timeout duration has elapsed since verification of at least one predetermined instability criterion, said timeout mechanism being reinitialized with the timeout duration every time that said at least one predetermined instability criterion is satisfied, wherein if said sampler is not blocked, said sampler copies the resultant signal at the output of said device.

2. The comparison device according to claim 1, wherein the at least one predetermined instability criterion comprises a switching of said resultant signal.

3. The comparison device according to claim 2, wherein said controller comprises a detector, which detects switching of said resultant signal, generates a detection signal in steps, that changes between a first value and a second value every time that a switching is detected, said timeout mechanism includes a time base with a loading input, to which said detection signal is applied, and an authorization input, to which an inverted detection signal is applied, such that:

when said detection signal is equal to said first value, said time base is preloaded with said timeout duration; then when said detection signal is equal to said second value, said time base authorizes said preloaded timeout duration to elapse.

4. The comparison device according to claim 3, wherein the detector comprises:

a flip-flop receiving said resultant signal and outputting a delayed resultant signal;

an EXCLUSIVE-OR logic gate that receives said resultant signal and said delayed resultant signal and that outputs said detection signal, such that:

if said resultant signal and said delayed resultant signal are at different logic levels, said EXCLUSIVE-OR logic gate fixes said detection signal equal to said first value;

if said resultant signal and said delayed resultant signal are at the same logic level, said EXCLUSIVE-OR logic gate fixes said detection signal equal to said second value.

5. The comparison device according to claim 3, wherein said time base includes a feedback from the output of said time base to said authorization input so as to block said time base when said timeout duration has elapsed, until a switching of said resultant signal is detected.

6. The comparison device according to claim 5, wherein said time base is programmable.

7. The comparison device according to claim 1, wherein said timeout duration is longer than the period of a lowest frequency noise to be deleted.

8. The comparison device according to claim 1, wherein said comparison device comprises a resynchronization circuit between said comparator and said controller so as to resynchronize said resultant signal on a clock signal.

9. The comparison device according to claim 8, wherein said resynchronization circuit comprises a flip-flop to copy said resultant signal to the output, at each active front of said clock signal.

10. An electronic circuit comprising a comparison device that receives an analogue input signal and a set value, and outputs a digital output signal, said output signal being capable of switching between a high logic level and a low logic level, or vise versa, said comparison device comprising:
 a one-threshold comparator receiving said input signal and said set value, said comparator generating a resultant signal that depends on the result of the comparison,
 a sample, which samples said resultant signal; and
 a controller, which blocks said sampler as long as a timeout mechanism does not indicate that a given timeout duration has elapsed since verification of at least one predetermined instability criterion, said timeout mechanism being reinitialized with the timeout duration every time that said at least one predetermined instability criterion is satisfied, wherein if said sampler is not blocked, said sampler copies the resultant signal at the output of said device.

11. A comparison device that receives an analogue input signal and a set value, and outputs a digital output signal, said output signal being capable of switching between a high logic level and a low logic level, or vice versa, said device comprising:
 a one-threshold comparator receiving said input signal and said set value, said comparator generating a resultant signal that depends on the result of the comparison,
 means of sampling said resultant signal; and
 control means for blocking said sampling means as long as a timeout mechanism does not indicate that a given timeout duration has elapsed since verification of at least one predetermined instability criterion, said timeout mechanism being reinitialized with the timeout duration every time that said at least one predetermined instability criterion is satisfied, wherein if said sampling means are not blocked,
 they are used to copy the resultant signal at the output of said device.

12. The comparison device according to claim 11, wherein the at least one predetermined instability criterion comprises a switching of said resultant signal.

13. The comparison device according to claim 12, wherein said control means include means of detecting switching of said resultant signal, generating a detection signal in steps, which changes between a first value and a second value every time that a switching is detected,
 said timeout mechanism includes a time base with a loading input, to which said detection signal is applied, and an authorization input, to which an inverted detection signal is applied, such that:
 when said detection signal is equal to said first value, said time base is preloaded with said timeout duration; then
 when said detection signal is equal to said second value, said time base authorizes said preloaded timeout duration to elapse.

14. The comparison device according to claim 13, wherein said switching detection means comprise:
 a flip-flop receiving said resultant signal and outputting a delayed resultant signal;
 an EXCLUSIVE-OR logic gate that receives said resultant signal and said delayed resultant signal and that outputs said detection signal, such that:
 if said resultant signal and said delayed resultant signal are at different logic levels, said EXCLUSIVE-OR logic gate fixes said detection signal equal to said first value;
 if said resultant signal and said delayed resultant signal are at the same logic level, said EXCLUSIVE-OR logic gate fixes said detection signal equal to said second value.

15. The comparison device according to claim 13, wherein said time base includes a feedback from the output of said time base to said authorization input so as to block said time base when said timeout duration has elapsed, until a switching of said resultant signal is detected.

16. The comparison device according to claim 15, wherein said time base is programmable.

17. The comparison device according to claim 11, wherein said timeout duration is longer than the period of a lowest frequency noise to be deleted.

18. The comparison device according to claim 11, wherein said comparison device comprises means of resynchronization between said comparator and said control means so as to resynchronize said resultant signal on a clock signal.

19. The comparison device according to claim 18, wherein said resynchronization means comprise a flip-flop to copy said resultant signal to the output, at each active front of said clock signal.

* * * * *